(12) United States Patent
Park et al.

(10) Patent No.: US 11,245,207 B2
(45) Date of Patent: Feb. 8, 2022

(54) STACK STRUCTURE OF PRINTED CIRCUIT BOARDS USING INTERPOSER AND ELECTRONIC DEVICE INCLUDING THE SAME

(71) Applicant: Samsung Electronics Co., Ltd., Gyeonggi-do (KR)

(72) Inventors: Jungsik Park, Gyeonggi-do (KR); Inkuk Yun, Gyeonggi-do (KR); Sunghyup Lee, Gyeonggi-do (KR); Heeseok Jung, Gyeonggi-do (KR); Woongeun Kwak, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 56 days.

(21) Appl. No.: 16/789,575

(22) Filed: Feb. 13, 2020

(65) Prior Publication Data
US 2020/0266562 A1     Aug. 20, 2020

(30) Foreign Application Priority Data
Feb. 19, 2019   (KR) .................. 10-2019-0019131

(51) Int. Cl.
| | |
|---|---|
| *H05K 5/00* | (2006.01) |
| *H01R 12/52* | (2011.01) |
| *H05K 1/11* | (2006.01) |

(52) U.S. Cl.
CPC ............ *H01R 12/52* (2013.01); *H05K 1/113* (2013.01); *H05K 1/119* (2013.01); *H05K 5/0004* (2013.01);
(Continued)

(58) Field of Classification Search
CPC ........ H01R 12/52; H05K 1/113; H05K 1/119; H05K 5/0004; H05K 5/0017
(Continued)

(56) References Cited

U.S. PATENT DOCUMENTS

| | | |
|---|---|---|
| 5,703,753 A | 12/1997 | Mok |
| 9,474,156 B2 | 10/2016 | Fosnes et al. |

(Continued)

FOREIGN PATENT DOCUMENTS

| | | | |
|---|---|---|---|
| JP | 2006-222341 | * | 8/2006 |
| JP | 2006-222341 A | | 8/2006 |
| KR | 10-2019-0029215 A | | 3/2019 |

OTHER PUBLICATIONS

International Search Report dated May 14, 2020.

*Primary Examiner* — Andargie M Aychillhum
(74) *Attorney, Agent, or Firm* — Cha & Reiter, LLC

(57) ABSTRACT

An electronic device is disclosed, including: a first support member including at least one screw-fastening portion; a first printed circuit board (PCB) stacked on the first support member and including at least one screw-fixing portion facing the at least one screw-fastening portion; a second PCB spaced apart from the first PCB, including a first screw guide groove; an interposer disposed between the first PCB and the second PCB electrically connecting them and including a second screw guide groove facing the first screw guide groove; and a second support member stacked on the second PCB and including a screw inlet portion facing the first screw guide groove. The second support member, the first PCB, and the first support member are fixed to each other via a screw inserted through the screw inlet portion.

19 Claims, 15 Drawing Sheets

(52) U.S. Cl.
 CPC . *H05K 5/0017* (2013.01); *H05K 2201/09163* (2013.01); *H05K 2201/10378* (2013.01)

(58) Field of Classification Search
 USPC ........................................................ 361/759
 See application file for complete search history.

(56) References Cited

U.S. PATENT DOCUMENTS

| | | |
|---|---|---|
| 9,913,387 B1 | 3/2018 | Muttam et al. |
| 2013/0148322 A1 | 6/2013 | Fosnes et al. |
| 2013/0343015 A1* | 12/2013 | Malek ................. H05K 1/0215 361/752 |
| 2018/0235071 A1 | 8/2018 | Barrass et al. |
| 2019/0082536 A1 | 3/2019 | Park et al. |

\* cited by examiner

STACK STRUCTURE OF PRINTED CIRCUIT BOARDS USING INTERPOSER AND ELECTRONIC DEVICE INCLUDING THE SAME

CROSS-REFERENCE TO RELATED APPLICATION(S)

This application is based on and claims priority under 35 U.S.C. 119 to Korean Patent Application No. 10-2019-0019131, filed on Feb. 19, 2019, in the Korean Intellectual Property Office, the disclosure of which is herein incorporated by reference in its entirety.

BACKGROUND

1) Field

Certain embodiments relate to a multilayer printed circuit board structure using an interposer and an electronic device including the same.

2) Description of Related Art

As the functional gap between electronic devices of respective manufacturers has been significantly reduced, electronic devices are becoming slimmer in order to satisfy consumers' purchasing desire. Developments are being made in order to increase the rigidity of electronic devices, improve design aesthetics, and make electronic devices slim. In particular, it is important for an electronic device to facilitate an effective electrical connection between electronic components disposed within, and to include a robust structure capable of maintaining the electrical connection between electronic components even if an external impact occurs.

The above information is presented as background information only to assist with an understanding of the disclosure. No determination has been made, and no assertion is made, as to whether any of the above might be applicable as prior art with regard to the disclosure.

SUMMARY

An electronic device may include one or more electronic components disposed in the internal space thereof. These electronic components may be electrically connected to each other in order to perform a corresponding function of the electronic device. Such electronic components may include at least two printed circuit boards disposed in the inner space of the electronic device. Respective printed circuit boards may be disposed within the device in various ways, including being stacked over each other in order to secure an efficient mounting space, and may be electrically connected to each other by an interposer disposed therebetween. In addition, the printed circuit boards may be fixed to at least one support member (e.g., a housing) provided in the electronic device via a separate fastening member (e.g., a screw). For example, a pair of printed circuit boards may be fixed to each other in a stacked configuration using a fastening member penetrating a support member as well as an interposer disposed therebetween, which may result in the assembly having a significant height.

However, since the stacked configuration of printed circuit boards has a considerably high configuration (and is fastened via a single screw) relative to the entire thickness of the electronic device, a printed circuit board may be displaced relative to the other printed circuit board by an external impact. As a result, the solder provided in the interposer to electrically connect the two printed circuit boards may be damaged, causing electrical disconnection of the two printed circuit boards, and resulting in a malfunction of the electronic device.

Certain embodiments provide a stack structure of printed circuit boards using an interposer and an electronic device including the stack structure.

Certain embodiments provide a stack structure of printed circuit boards using an interposer having a robust structure in which deformation does not occur even if an external impact is applied thereto, and an electronic device including the stack structure.

According to certain embodiments, an electronic device may include: a first support member disposed in an inner space defined within the electronic device and including at least one screw-fastening portion, a first printed circuit board stacked on the first support member and including at least one screw-fixing portion disposed facing the at least one screw-fastening portion, a second printed circuit board spaced apart from the first printed circuit board and including at least one first screw guide groove facing the at least one screw-fixing portion, an interposer disposed between the first printed circuit board and the second printed circuit board to electrically connect the first printed circuit board and the second printed circuit board, and the interposer including at least one second screw guide groove facing the at least one first screw guide groove, and a second support member stacked on the second printed circuit board and including a screw inlet portion facing the at least one first screw guide groove, wherein the second support member, the first printed circuit board, and the first support member are affixed to each other via a screw inserted through the screw inlet portion in the second support member.

According to certain embodiments, an electronic device may include: a housing including a first plate, a second plate facing away from the first plate, and a side member surrounding a space defined between the first plate and the second plate, a first support member disposed in the space substantially in parallel with the first plate, and including at least one screw-fastening portion, a first printed circuit board disposed between the first support member and the second plate, including at least one screw-fixing portion facing the at least one screw-fastening portion, a second printed circuit board disposed between the first printed circuit board and the second plate, including at least one first screw guide groove facing the at least one screw-fixing portion, an interposer disposed between the first printed circuit board and the second printed circuit board, electrically connecting the first printed circuit board and the second printed circuit board, and including at least one second screw guide groove facing the at least one first screw guide groove, and a second support member disposed between the second printed circuit board and the second plate, including a screw inlet portion facing the at least one first screw guide groove, wherein the second support member, the first printed circuit board, and the first support member are fixed to each other via a screw applied through the screw inlet portion in the second support member.

BRIEF DESCRIPTION OF THE DRAWINGS

For a more complete understanding of the disclosure and its advantages, reference is now made to the following description taken in conjunction with the accompanying drawings, in which like reference numerals represent like parts.

DETAILED DESCRIPTION

FIGS. 1 through 9C, discussed below, and the certain embodiments used to describe the principles of the present disclosure in this patent document are by way of illustration only and should not be construed in any way to limit the disclosure. Those skilled in the art will understand that the principles of the present disclosure may be implemented in any suitably arranged system or device.

Hereinafter, embodiments of the present disclosure are described in detail with reference to accompanying drawings.

Figure 1:
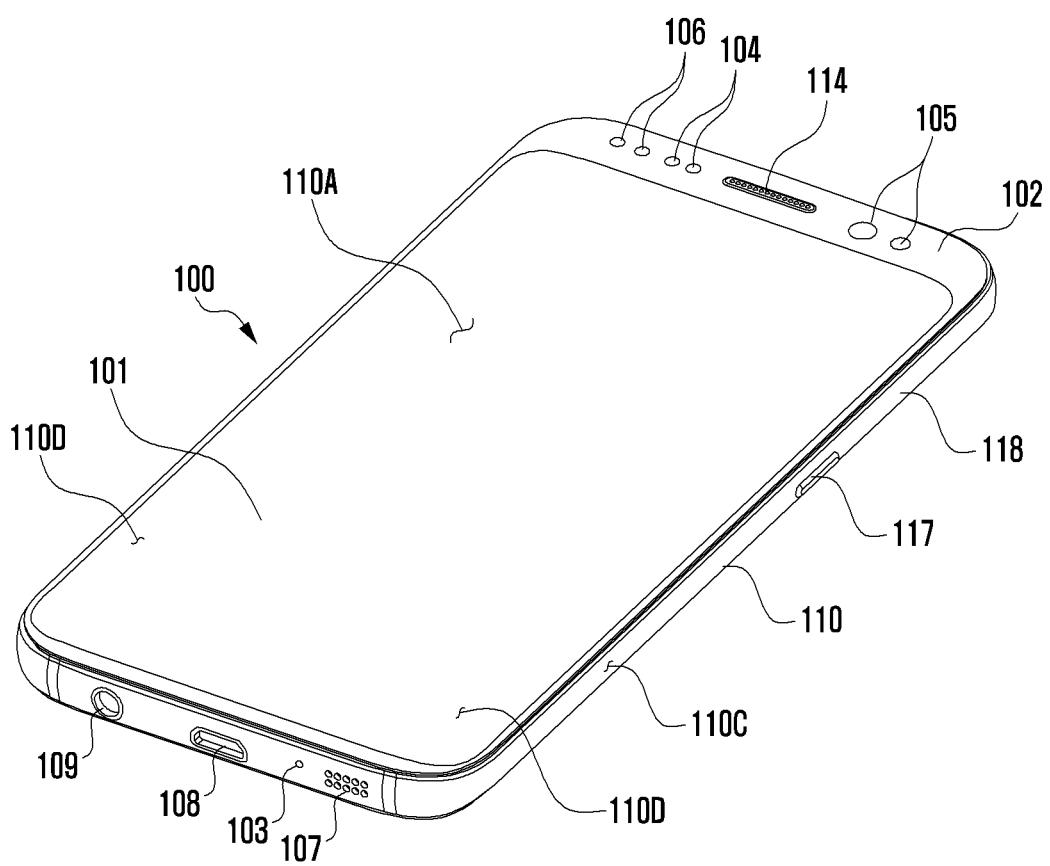
FIG. 1 is a perspective view illustrating a front side of a mobile electronic device according to certain embodiments.
Figure 2:
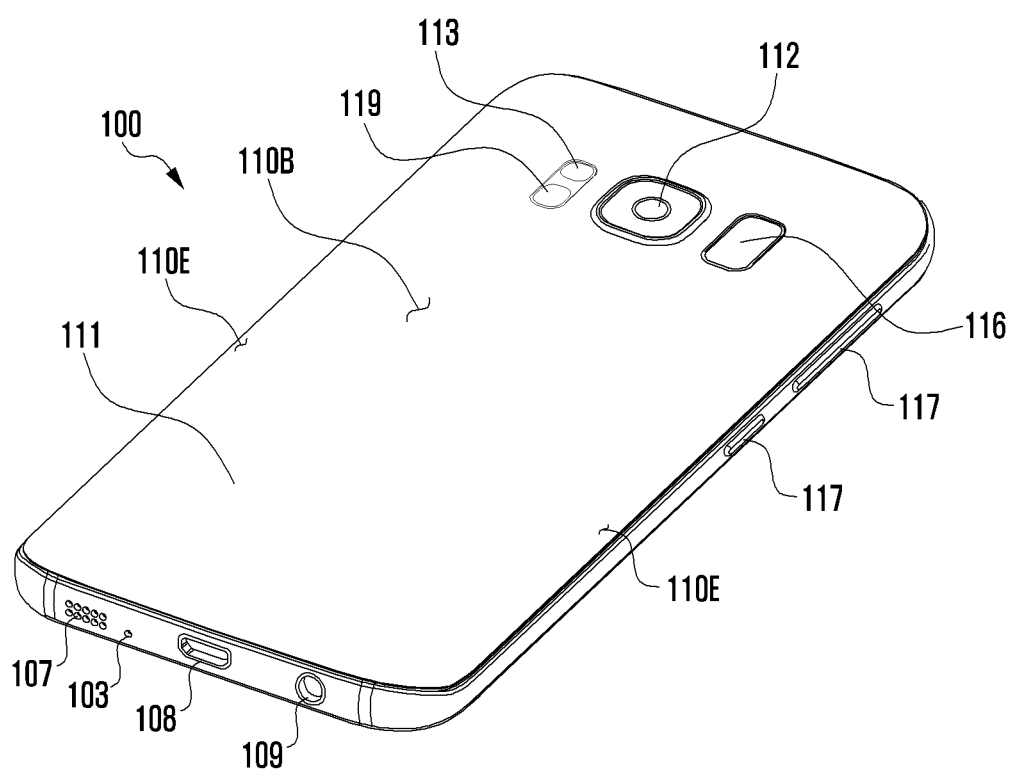
FIG. 2 is a perspective view illustrating a rear side of the electronic device of FIG. 1.

FIG. 1 illustrates a perspective view showing a front surface of a mobile electronic device 100 according to an embodiment, and FIG. 2 illustrates a perspective view showing a rear surface of the mobile electronic device 100 shown in FIG. 1.

Referring to FIGS. 1 and 2, the mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, audio modules operably coupled to the holes 103, 107 and 114, sensor modules 104, 116 and 119, camera modules 105, 112 and 113, a key input device 117, a light emitting device 106, and connector holes 108 and 109. The mobile electronic device 100 may omit at least one (e.g., the key input device 117 or the light emitting device 106) of the above components, or may further include other components.

The display 101 may be exposed through a substantial portion of the front plate 102, for example. At least a part of the display 101 may be exposed through the front plate 102 that forms the first surface 110A and the first region 110D of the lateral surface 110C. Outlines (i.e., edges and corners) of the display 101 may have substantially the same form as those of the front plate 102. The spacing between the outline of the display 101 and the outline of the front plate 102 may be substantially unchanged in order to enlarge the exposed area of the display 101.

A recess or opening may be formed in a portion of a display area of the display 101 to accommodate at least one of the audio module (e.g., operably coupled to hole 114), the sensor module 104, the camera module 105, and the light emitting device 106. At least one of the audio module (e.g., operably coupled to whole 114), the sensor module 104, the camera module 105, the fingerprint sensor 116, and the light emitting element 106 may be disposed on the back of the display area of the display 101. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules operably coupled to the holes 103, 107 and 114 may correspond to a microphone hole 103 and speaker holes 107 and 114, respectively. The microphone hole 103 may contain a microphone disposed therein for acquiring external sounds and, in a case, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104, 116 and 119 may generate electrical signals or data corresponding to an internal operating state of the mobile electronic device 100 or to an external environmental condition. The sensor modules 104, 116 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module 116 (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device 105 disposed on the first surface 110A of the electronic device 100, and a second camera device 112 and/or a flash 113 disposed on the second surface 110B. The camera module 105 or the camera module 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101. The key input device 117 may include the sensor module 116 disposed on the second surface 110B of the housing 110.

The light emitting device 106 may be disposed on the first surface 110A of the housing 110. For example, the light emitting device 106 may provide status information of the electronic device 100 in an optical form. The light emitting device 106 may provide a light source associated with the operation of the camera module 105. The light emitting device 106 may include, for example, a light emitting diode (LED), an IR LED, or a xenon lamp.

The connector holes 108 and 109 may include a first connector hole 108 adapted for a connector (e.g., a universal serial bus (USB) connector) for transmitting and receiving power and/or data to and from an external electronic device, and/or a second connector hole 109 adapted for a connector (e.g., an earphone jack) for transmitting and receiving an audio signal to and from an external electronic device.

Figure 3:
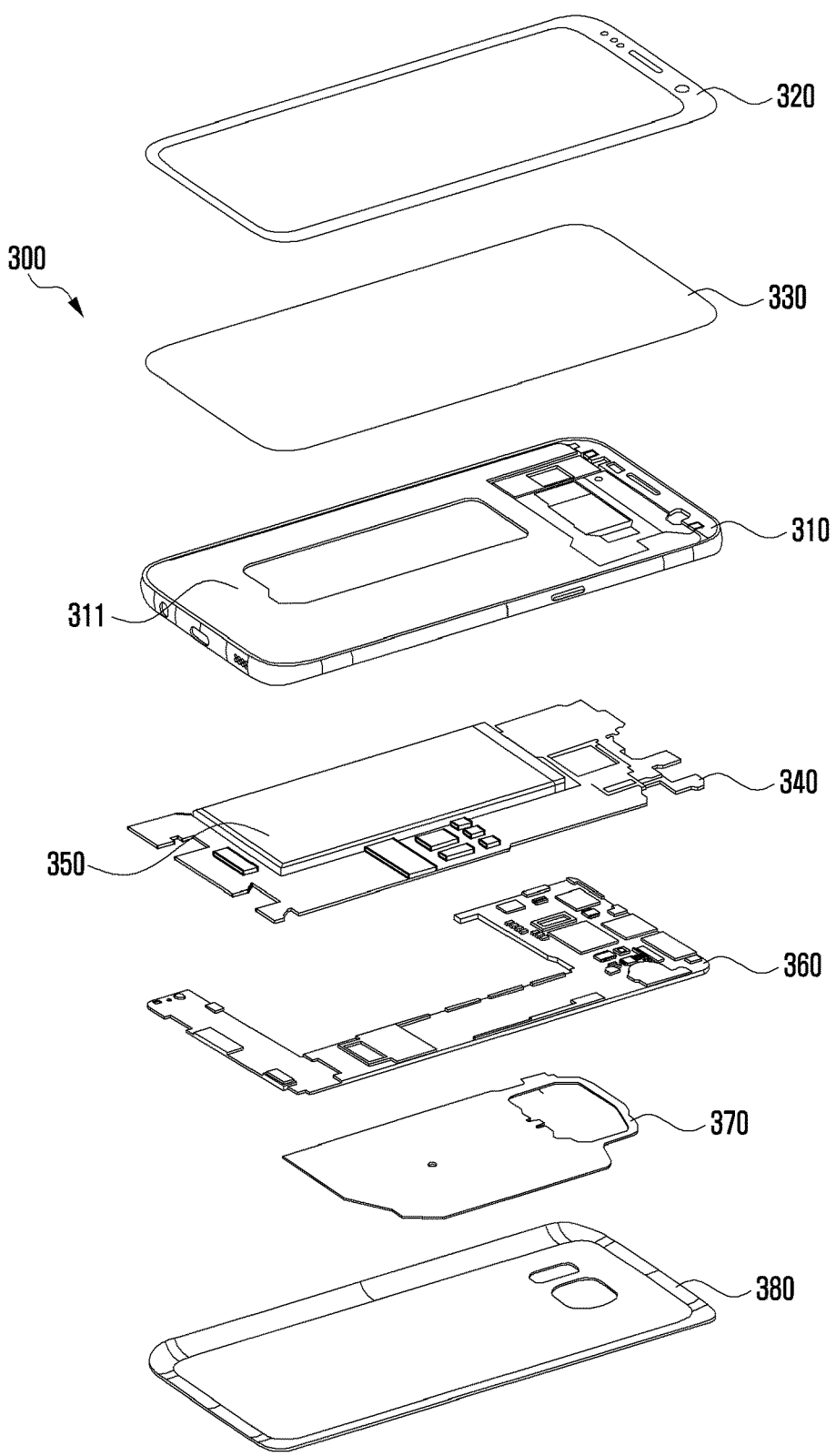
FIG. 3 is an exploded perspective view illustrating the electronic device of FIG. 1.

FIG. 3 illustrates an exploded perspective view showing a mobile electronic device 300 shown in FIG. 1.

Referring to FIG. 3, the mobile electronic device 300 may include a lateral bezel structure 310, a first support member 311 (e.g., a bracket), a front plate 320, a display 330, an electromagnetic induction panel (not shown), a printed circuit board (PCB) 340, a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the electronic device 300 may be the same as or similar to those of the mobile electronic device 100 shown in FIG. 1 or FIG. 2, thus, descriptions thereof are omitted below.

According to certain embodiments, the side member 310 may be integrally formed with the first support member 311. According to an embodiment, the side member 310 may include a first surface 3101 facing the front plate 320, a second surface 3102 facing in a direction opposite to that of the first surface 3101 and facing the rear plate 380, and a side surface 3103 enclosing a space between the first surface 3101 and the second surface 3102. According to an embodiment, the first support member 311 may be formed to extend in an internal space direction of the electronic device 300 from the side surface.

The first support member 311 is disposed inside the mobile electronic device 300 and may be connected to, or integrated with, the lateral bezel structure 310. The first support member 311 may be formed of, for example, a metallic material and/or a non-metal (e.g., polymer) material. The first support member 311 may be combined with the display 330 at one side thereof and also combined with the PCB 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, volatile memory or non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power utilized for charging wirelessly. An antenna structure may be formed by a part or combination of the lateral bezel structure 310 and/or the first support member 311.

Figure 4A:
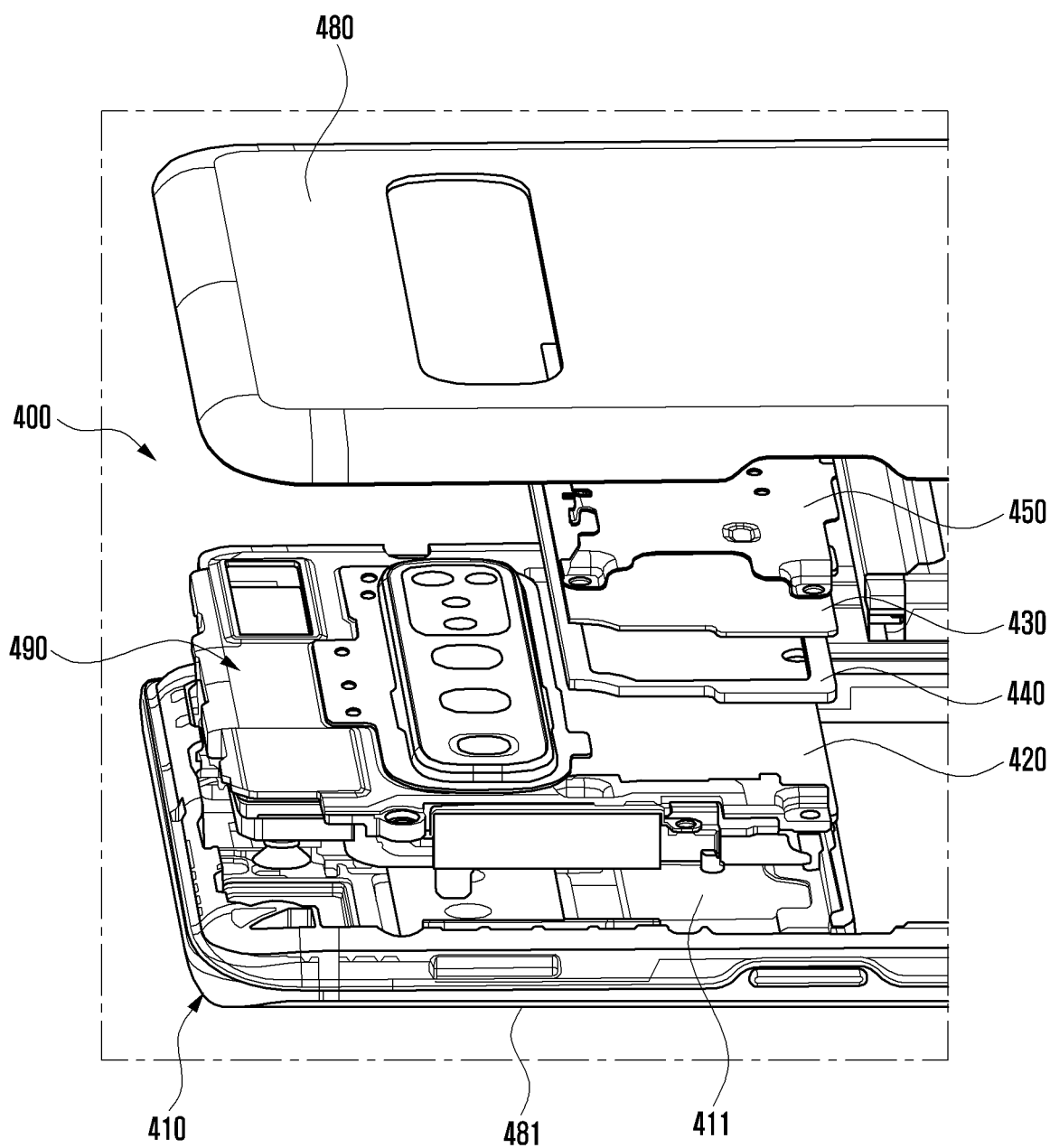
FIG. 4A is a perspective view of an electronic device in which a printed circuit board stack structure according to certain embodiments is illustrated.
Figure 4B:
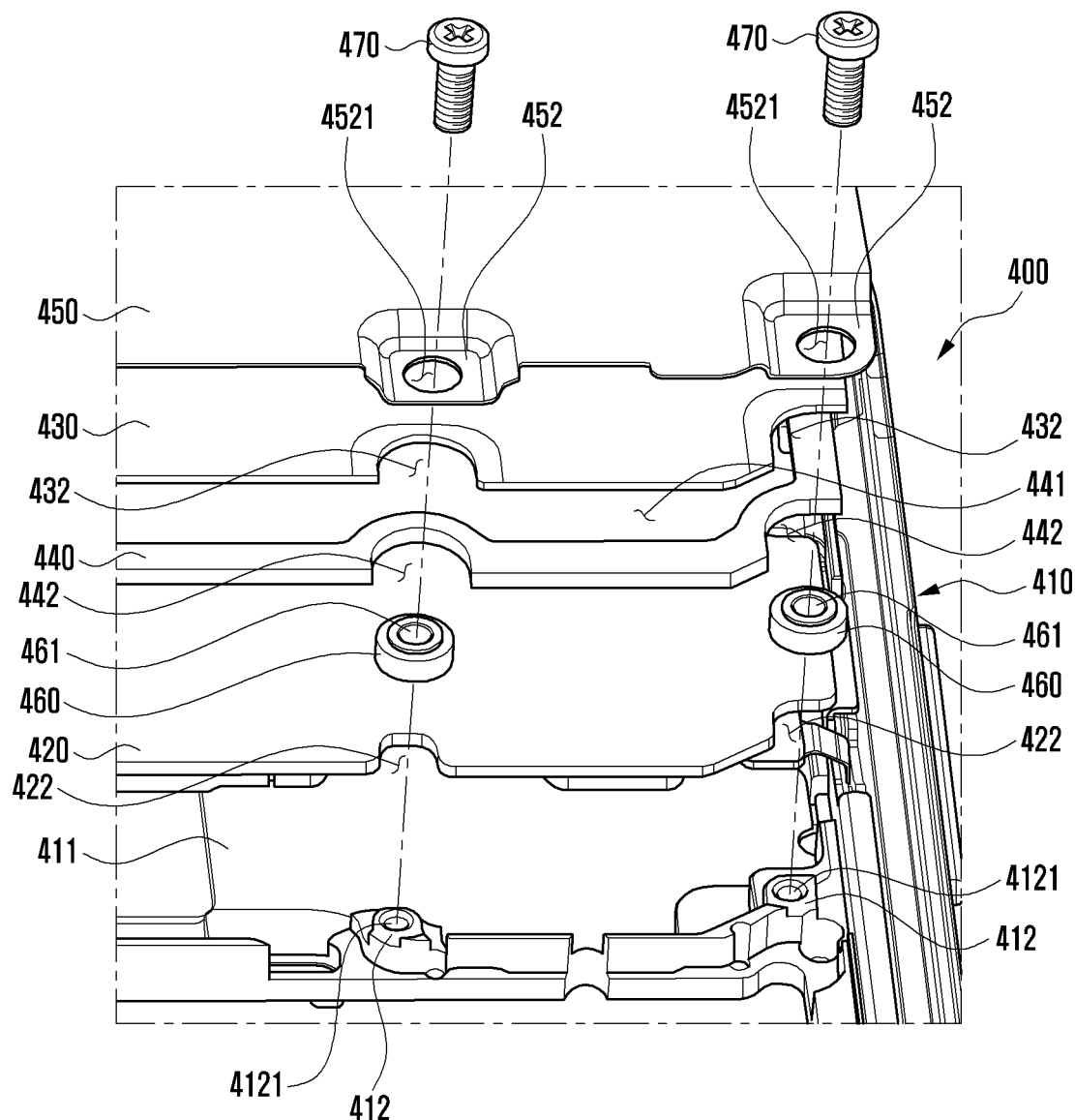
FIG. 4B is a perspective view of an electronic device in which a printed circuit board stack structure according to certain embodiments is illustrated.

FIG. 4A is a perspective view of an electronic device 400 in which a stack structure of printed circuit boards 420 and 430 according to certain embodiments is illustrated, and FIG. 4B a perspective view of an electronic device 400 in which a stack structure of printed circuit boards 420 and 430 according to certain embodiments is illustrated.

The electronic device 400 of FIG. 4A may be at least partially similar to the electronic device 300 of FIG. 3 or may further include other embodiments of an electronic device.

Referring to FIGS. 4A and 4B, the electronic device 400 (e.g., the electronic device 300 in FIG. 3) may include a housing (e.g., the housing 110 in FIG. 1A) including a first plate 481 (e.g., the front plate 320 in FIG. 3), a second plate 480 (the rear plate 380 in FIG. 3) facing away from the first plate 481, and a side member 410 (e.g., the side member 310 in FIG. 3) surrounding the space defined between the first plate 481 and the second plate 480. According to an embodiment, the electronic device 400 may include a first support member 411 (e.g., the first support member 311 in FIG. 3) disposed in the inner space thereof. According to an embodiment, the first support member 411 may be disposed to extend into the inner space from the side member 410. As another example, the first support member 411 may be separately provided in the inner space of the electronic device 400. According to an embodiment, the first support member 411 may extend from the side member 410, and may be at least partially formed of a conductive material. According to an embodiment, the electronic device 400 may include a camera structure 490 disposed in a space defined between the first plate 481 and the second plate 480.

According to certain embodiments, the electronic device 400 may include a pair of printed circuit boards 420 and 430 disposed between the first plate 411 and the second plate 480 in the inner space thereof. According to an embodiment, the pair of printed circuit boards 420 and 430 may be arranged to at least partially overlap each other when the first plate 481 is viewed from above. According to an embodiment, the pair of printed circuit boards 420 and 430 may include a first printed circuit board 420 (e.g., a main substrate) disposed between the first support member (or plate) 411 and the second plate 480, and a second printed circuit board 430 (e.g., a sub-substrate) disposed between the first printed circuit board 420 and the second plate 480. According to an embodiment, the electronic device 400 may include an interposer 440 disposed between the first printed circuit board 420 and the second printed circuit board 430. According to an embodiment, the interposer 440 may electrically interconnect the two printed circuit boards 420 and 430 by being soldered to the first printed circuit board 420 and the second printed circuit board 430 via a plurality of conductive vias. According to an embodiment, the interposer 440 may have substantially the same shape as at least one of the first printed circuit board 420 and the second printed circuit board 430, and may define an opening 441 in the center thereof. According to an embodiment, the opening 441 may accommodate electronic components (e.g., various electrical elements or shield cans) disposed on at least one of the two printed circuit boards 420 and 430. According to an embodiment, the electronic device 400 may include a second support member 450 disposed between the second printed circuit board 420 and the second plate 480. According to an embodiment, the second support member 450 may be disposed at a position at which the second support member 450 at least partially overlaps the second circuit board 430. According to an embodiment, the second support member 450 may include a metal plate.

According to certain embodiments, the electronic device 400 may include a stack structure in which the first printed circuit board 420, the interposer 440, the second printed circuit board 430, and the second support member 450 are stacked on the first support member (or plate) 411. According to an embodiment, the electronic device 400 may include at least one screw 470 that passes through at least a portion of the first printed circuit board 420 and the interposer 440 so as not to be involved in fastening and is fastened such that the first printed circuit board 420 is fixed to the first support member 411 via the second support member 450 (e.g., in an exclusive sense).

According to certain embodiments, the first support member 411 may include at least one screw-fastening part 412 including a screw-fastening hole 4121. According to an embodiment, the first printed circuit board 420 may include at least one screw-fixing portion 422 formed at a position facing the at least one screw-fastening portion 412. According to an embodiment, the screw-fixing portion 422 may include a recess having a predetermined size formed in a portion of an edge of the first printed circuit board 420. In another embodiment, the screw-fixing portion 422 may include a through hole formed in the first printed circuit board 420.

According to an embodiment, the second printed circuit board 430 may include at least one first screw guide groove 432 formed at a position facing the at least one screw-fixing portion 422. According to an embodiment, the interposer 440 may include at least one second screw-guide groove 442 formed at a position facing the first screw guide groove 432 in the second printed circuit board 430. According to an embodiment, the first screw guide groove 432 and the second screw guide groove 442 may have the same size and shape. The first screw guide groove 432 and the second screw guide groove 442 may guide the screw to be fastened, but may be formed to a size not involved in fastening. According to an embodiment, each of the first screw guide groove 432 and the second screw guide groove 442 may include a recess formed in a portion of an edge of one of the second printed circuit board 430 and the interposer 440. According to an embodiment, each of the first screw guide groove 432 and the second screw guide groove 442 may include a through hole formed through one of the second printed circuit board 430 and the interposer 440.

According to certain embodiments, the second support member 450 may include a screw inlet portion 452 formed at a position facing the screw-fixing portion 442 of the first printed circuit board 420. According to an embodiment, the screw inlet portion 452 may include a through hole 4521 through which the screw 470 passes. According to an embodiment, the screw inlet portion 452 may be formed as to be lower than the face of the second support member 450. For example, when the second support member 450 includes a metal plate, the screw inlet portion 452 may be formed through a pressing or molding process. For example, when the second support member 450 is made of a polymer material, the screw inlet portion 452 may be formed through a pressing or injection-molding process. According to an embodiment, the screw 470 fastened through the second support member 450 may not protrude from the outer face of the second support member 450 thanks to the screw inlet portion 452.

According to certain embodiments, the electronic device 400 may include a washer member 460 having a predetermined thickness to press or support the first printed circuit board 420 while being accommodated in the first screw guide groove 432 and the second screw guide groove 442. According to an embodiment, the washer member 460 may be formed to have a thickness compensating for the thicknesses of the second printed circuit board 430 and the interposer 440, which are not involved in fastening the screw 470. Accordingly, the screw 470 introduced into the screw inlet portion 452 in the second support member 450 passes through the through hole 461 of the washer member 460, and is then fastened to the screw-fastening portion 412 in the first support member 411, whereby the first printed circuit board 420 may be firmly fixed to the first support member 411 via the second support member 450. For example, the second circuit board 430 may be fixed to the first printed circuit board 420 via the interposer 440. This is due to the fact that the interposer 440 is fixed to the first printed circuit board 420 and the second printed circuit board 430 through a soldering process using solder.

According to certain embodiments, even if the first support member 411, the first printed circuit board 420, the interposer 440, the second printed circuit board 430, and the second support member 450 are stacked to have a height via the screw 470, since the first printed circuit board 420 is fixed to the first support member 411 via the second support member 450, it is possible to prevent the interposer 440 from being damaged by an external impact. Furthermore, even if the second printed circuit board 430 is not involved in screw fastening, since the peripheral area except for the first screw guide groove 432 has an area overlapping the interposer 440, it may be advantageous to secure a wider electrical element mounting space.

As another embodiment, it is possible to replace the role of the washer member by adjusting the height and shape of the screw-fastening portion 412 without the washer member 460. For example, the screw-fastening portion 412 may extend from the first support member 411 to a predetermined height, may pass through the first printed circuit board 420, the interposer 440, and the second printed circuit board 430, and may be then fastened with the screw 470 via the second support member 450.

Figure 5A:
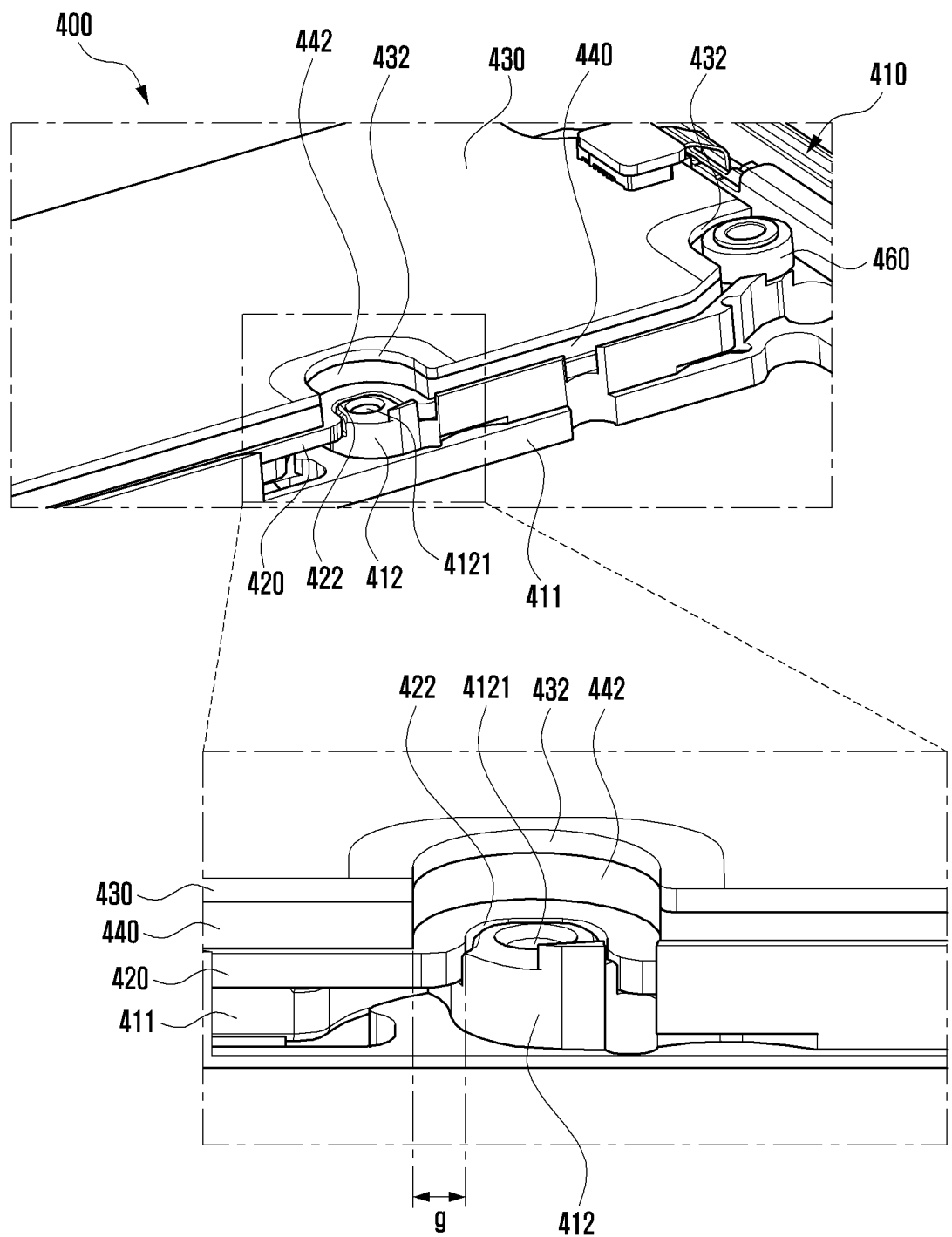
FIG. 5A is a perspective view partially illustrating the state in which two printed circuit boards are stacked via an interposer according to various embodiment.
Figure 5B:
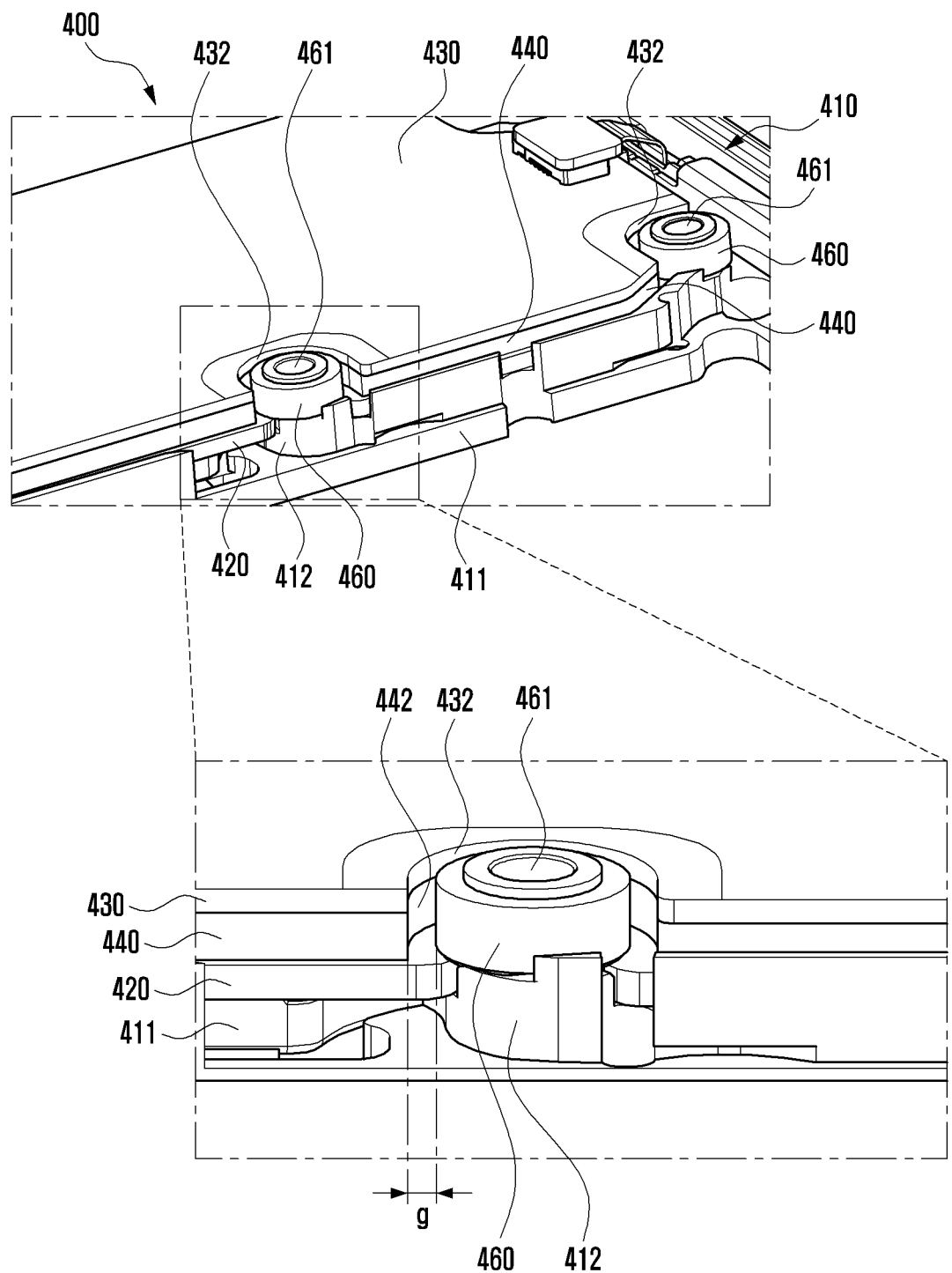
FIG. 5B is a perspective view partially illustrating the state in which two printed circuit boards are stacked via an interposer according to various embodiment.

FIG. 5A is a perspective view partially illustrating the state in which two printed circuit boards 420 and 430 are stacked via an interposer 440 according to various embodiment, and FIG. 5B is a perspective view partially illustrating the state in which two printed circuit boards 420 and 430 are stacked via an interposer 440 according to certain embodiments.

Referring to FIGS. 5A and 5B, the first printed circuit board 420, the interposer 440, and the second printed circuit board 430 may be sequentially stacked on the first support member 411. In this case, the screw-fastening portion 412 in the first support member 411 and the screw-fixing portion 422 in the first printed circuit board 420 may be disposed to face each other. According to an embodiment, the first screw guide groove 432 in the second printed circuit board 430 and the second screw guide groove 442 in the interposer 440 may also be disposed at positions facing the screw-fixing portion 422.

According to certain embodiments, the first screw guide groove 432 in the second printed circuit board 430 and the second screw guide groove 442 in the interposer 440 may have a size and shape not to be involved in screw fastening. According to an embodiment, the first screw guide groove 432 in the second printed circuit board 430 and the second screw guide groove 442 in the interposer 440 may be formed to have a size and/or a shape including the screw-fixing portion 422 in the first printed circuit board 420 when the first plate (e.g., the first plate 481 in FIG. 4) is viewed from above. For example, as illustrated, when the first plate (e.g., the first plate 481 in FIG. 4A) is viewed from above, the first screw guide groove 432 and the second screw guide groove 442 may have the same shape, and may have a predetermined gap g with the screw-fixing portion 422. According to an embodiment, through this gap g, a screw (e.g., the screw 470 in FIG. 4B) may fix the first printed circuit board 420 to the first support member 411 without coming into contact with the first screw guide groove 432 and the second screw guide groove 442.

According to certain embodiments, the first screw guide groove 432 and the second screw guide groove 442 are not involved in screw fastening, but guide the screw (e.g., the screw 470 in FIG. 4B) and are disposed in the interposer 440 and the second printed circuit board 430, which overlap the first printed circuit board 420. Thus, it is possible to compensate for the height used for screw fastening. Accordingly, the electronic device 400 may include a washer member 460 disposed at a position corresponding to the first screw guide groove 432 and the second screw guide groove 442. According to an embodiment, the washer member 460 may be disposed to include the screw-fixing portion 422 above the first printed circuit board 420 while being simultaneously accommodated in the first screw guide groove 432 and the second screw guide groove 442.

Figure 6A:
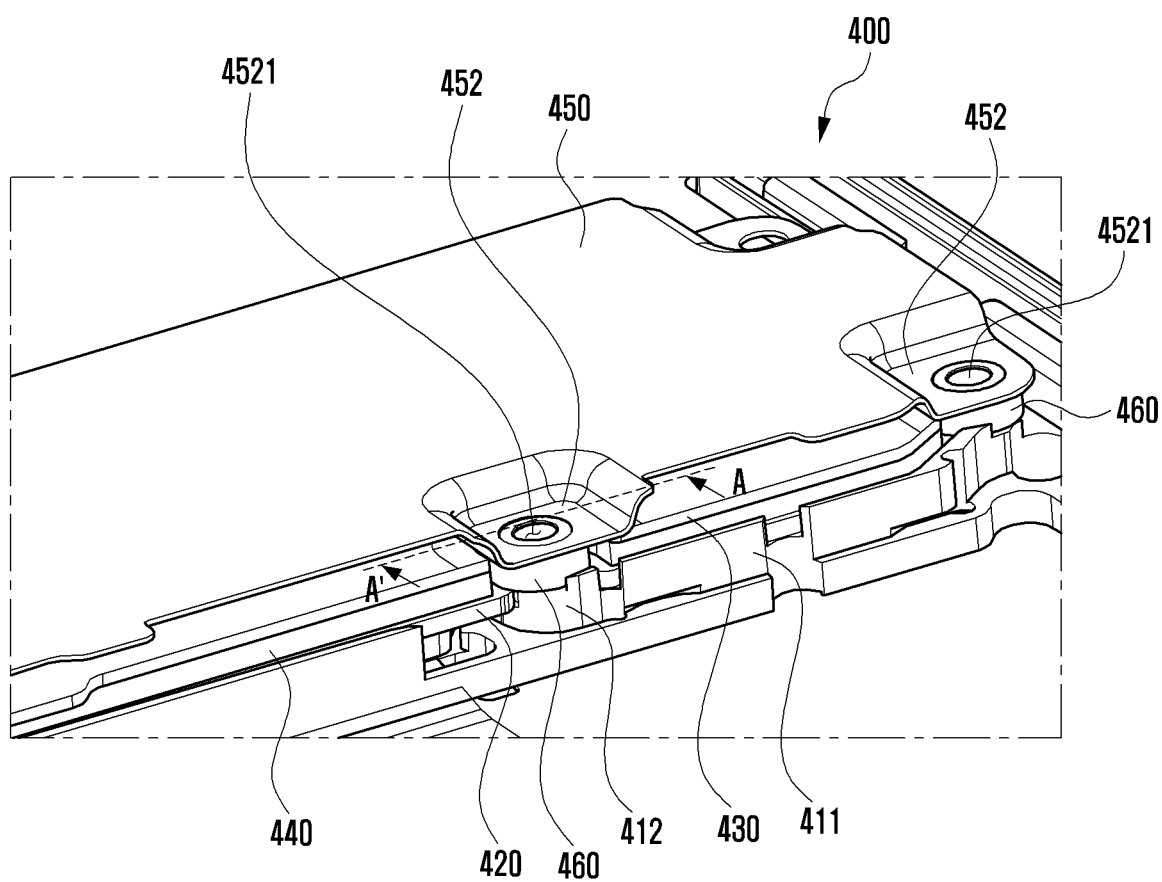
FIG. 6A is a perspective view partially illustrating the state in which a second support member is disposed via a washer member according to certain embodiments.
Figure 6B:
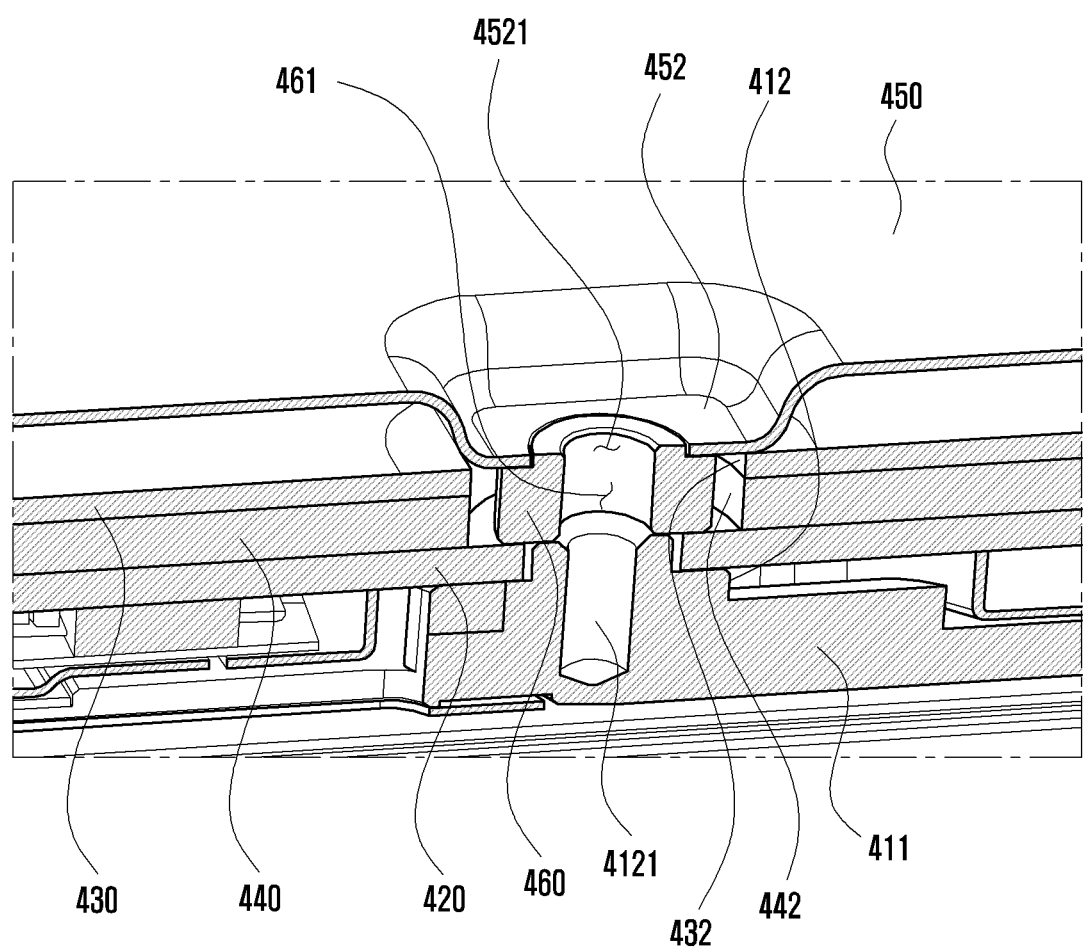
FIG. 6B is a perspective view partially illustrating the state in which the second support member is disposed via the washer member according to certain embodiments.

FIG. 6A is a perspective view partially illustrating the state in which the first support member 450 is disposed via the washer member 460 according to certain embodiments, and FIG. 6B is a perspective view partially illustrating the state in which the first support member 422 is disposed via the washer member 460 according to certain embodiments.

FIG. 6B illustrates a cross section of the electronic device 400 taken along line A-A' in FIG. 6A.

Referring to FIGS. 6A and 6B, in the state in which the washer member 460 is accommodated in the first screw guide groove 432 and the second screw guide groove 442 and is disposed on the first printed circuit board 420, the second support member 450 may be disposed on the second printed circuit board 430. In this case, the screw inlet portion 452 in the second support member 450 may be disposed at a position facing the washer member 460. For example, a through hole 4521 in the screw inlet portion 452, the through hole 461 in the washer member 460, and a fastening hole 4121 in the first support member 411 may be aligned to overlap each other. Accordingly, when a screw (e.g., the screw 470 in FIG. 4B) is fastened through the through hole 4521 in the screw inlet portion 452, the screw may be fastened to the fastening hole 4121 in the first support member 411 through the through hole 461 in the washer member 460. In this case, the second support member 450 is pressed towards the first support member 411 due to the fastening of the screw (e.g., the screw 470 in FIG. 4B), and the washer member 460 presses the top face of the first printed circuit board 420 by the pressed second support member 450, whereby the first printed circuit board 420 can be firmly fixed to the first support member 411. As another embodiment, the screw may be simultaneously fastened to the screw-fixing portion 422 in the first printed circuit board 420 and the screw-fastening portion 412 in the first support member 411.

According to certain embodiments, even if the first printed circuit board 420 is fixed to the first support member 411 via the washer member 460, the second printed circuit board 430 and the interposer 440 are capable of being supported in the positions thereof without being involved in screw fastening. Therefore, even when an impact is transmitted from the outside of the electronic device 400, the second printed circuit board 430 and the interposer 440 may be prevented from being distorted with respect to the first printed circuit board 420.

Figure 7:
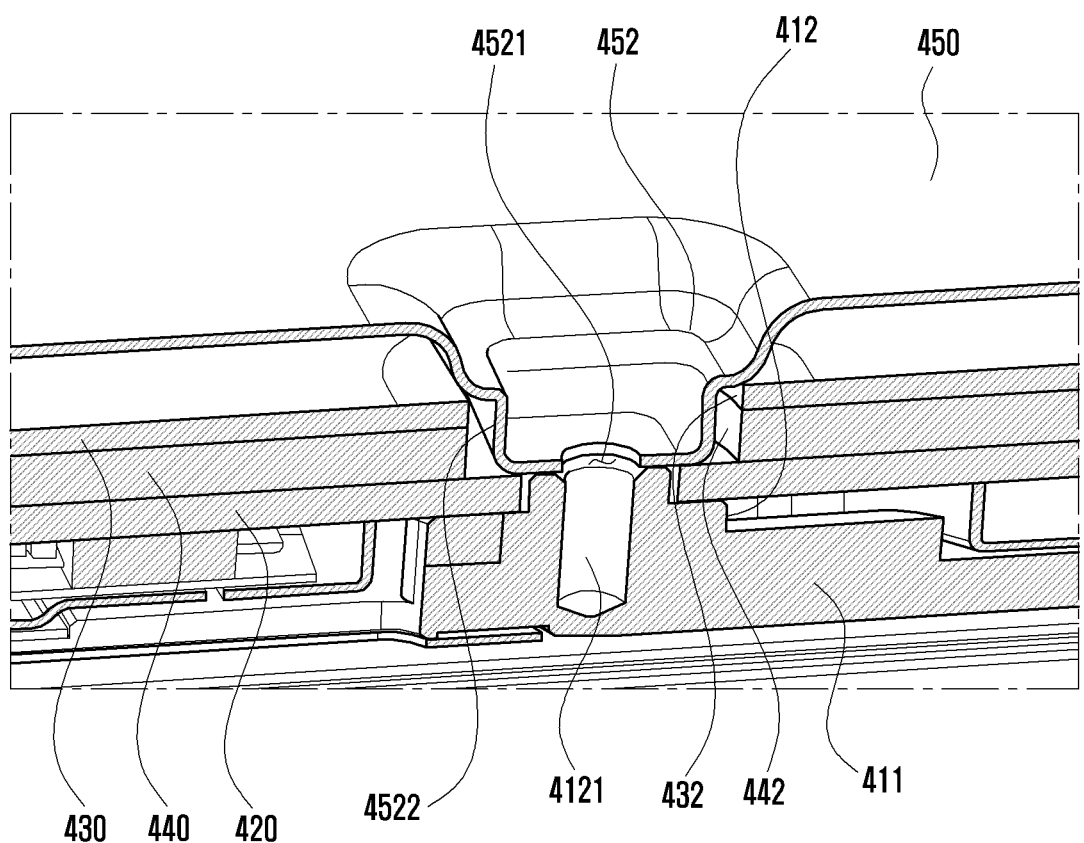
FIG. 7 is a perspective view partially illustrating the state in which a first printed circuit board is fixed to a first support member via a second support member according to certain embodiments.

FIG. 7 is a perspective view partially illustrating the state in which the first printed circuit board 420 is fixed to the first support member 411 via the second support member 450 according to certain embodiments.

Referring to FIG. 7, in order to compensate for the heights of the first screw guide groove 432 and the second screw guide groove 442, a separate washer member (e.g., the washer member 460 of FIG. 6A) may be omitted, and the screw inlet portion 452 in the second support member 450 may also serve as a washer member only by changing the structure change thereof. For example, the screw inlet portion 452 may include an extension 4522 extending to the top face of the first printed circuit board 420, and the through hole 4451 may be formed in the extension 4522. Accordingly, when the second support member 450 is disposed on the second printed circuit board 430, the extension 4522 may be disposed to substantially come into contact with the first printed circuit board 420 while being guided by the first screw guide groove 432 and the second screw guide groove 442.

Figure 8A:
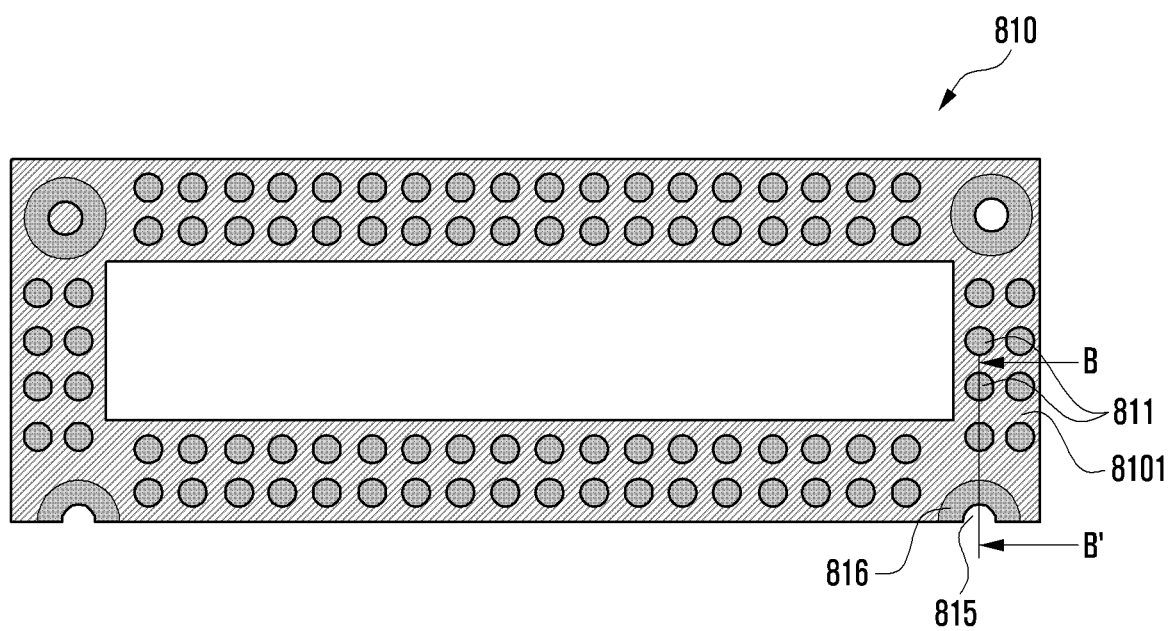
FIG. 8A is a plan view illustrating the configuration of an interposer according to certain embodiments.
Figure 8B:
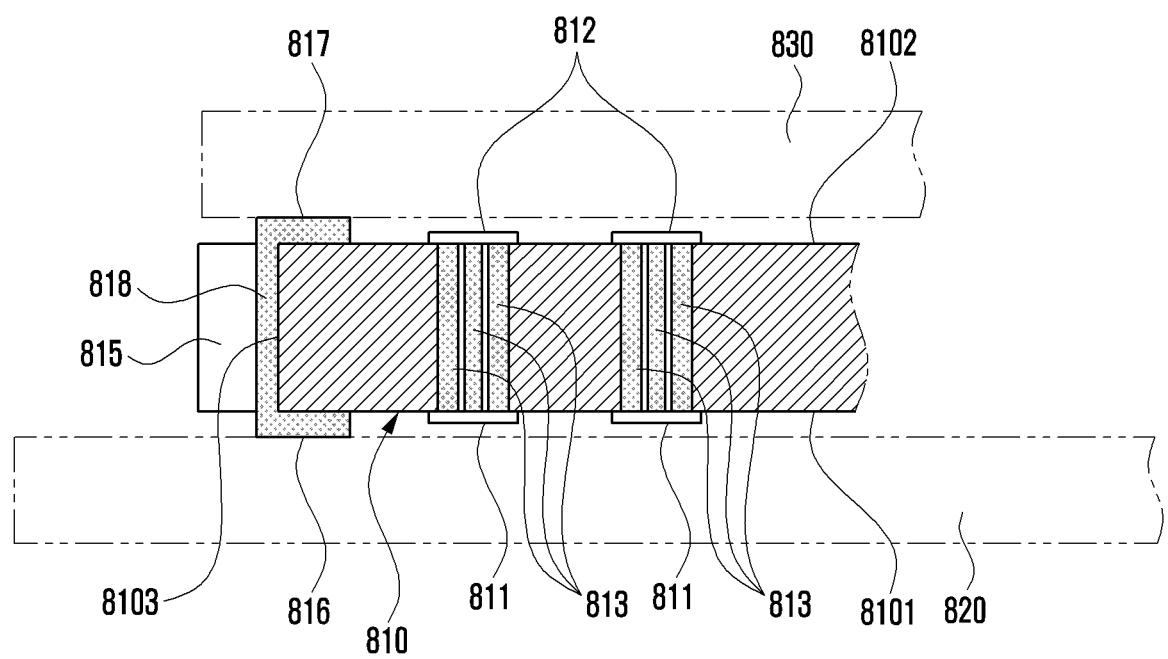
FIG. 8B is a cross-sectional view illustrating a portion of the interposer taken along line B-B' in FIG. 8A.

FIG. 8A is a plan view illustrating the configuration of an interposer 810 according to certain embodiments. FIG. 8B is a cross-sectional view illustrating a portion of the interposer 810 taken along line B-B' in FIG. 8A.

The interposer 810 in FIG. 8A may be at least partially similar to the electronic device 400 of FIG. 4A or may further include other embodiments of an interposer.

Referring to FIGS. 8A and 8B, the interposer 810 (e.g., the interposer 440 in FIG. 4B) may include a first face 8101 facing a first printed circuit board 820 (e.g., the first printed circuit board 420 in FIG. 4B), a second face 8102 (FIG. 8B) facing away from the first face 8101 and facing a second printed circuit board 830 (e.g., the second printed circuit board 430) in FIG. 4B), and a side face 8103 surrounding the space between the first face 8101 and the second face 8102. According to an embodiment, the interposer 810 may include a plurality of first connection pads 811 disposed on the first face 8101 and a plurality of second connection pads 812 disposed on the second face 8102. According to an embodiment, the plurality of first connection pads 811 and the plurality of second connection pads 812 may be electrically connected to each other via a plurality of conductive vias 813 formed to penetrate the interposer 810 from the first face 8101 to the second face 8102. According to an embodiment, the plurality of first connection pads 811 may be electrically connected to the first printed circuit board 820, and the plurality of second connection pads 812 may be electrically connected to the second printed circuit board 830. According to an embodiment, the plurality of first connection pads 811 and the plurality of second connection pads 812 may be used for transmission of electrical signals (e.g., a data signal and/or a ground signal) between the first printed circuit board 820 and the second printed circuit board 830. According to an embodiment, the plurality of first connection pads 811 and the plurality of second connection pads 812 may include solder applied to the first face 8101 and the second face 8102.

According to certain embodiments, a first unit connection pad 811 of each of the plurality of first connection pads 811 may be electrically connected to a second unit connection pad 812 of each of the plurality of second connection pads 812 via at least two conductive vias 813. For example, the first unit connection pads 811 are electrically connected to the second unit connection pads 812 via the plurality of conductive vias 813. Thus, even if any one of the conductive vias is damaged by an external impact, smooth electrical connection between the first unit connection pads 811 and the second unit connection pads 812 may be enabled via remaining vias.

According to certain embodiments, the interposer 810 may include a screw guide groove 815 (e.g., the second screw guide groove 442 in FIG. 4B) disposed at an edge and/or a corner portion. According to an embodiment, the interposer 810 may include a first support pad 816 and a second support pad 817, which are disposed on the first face 8101 and the second face 8102, respectively, around the screw guide groove 815. According to an embodiment, the first support pad 816 and the second support pad 817 may be disposed to surround the screw guide groove 815 on the first face 8101 and the second face 8102, respectively. According to an embodiment, the first support pad 816 and the second support pad 817 may be formed in order to prevent breakage due to the contact with the screw and/or washer passing through the screw guide groove 815 and to reinforce rigidity. According to an embodiment, the first support pad 816 and the second support pad 817 may be used for transmission of electrical signals (e.g., a data signal and/or a ground signal) between the first printed circuit board 820 and the second printed circuit board 830.

According to certain embodiments, the first support pad 816 and the second support pad 817 may be electrically connected to each other via a conductive material 818 applied to the side face 8103 of the interposer 810 in the screw guide groove 815. In another embodiment, the first support pad 816, the conductive material 818, and the second support pad 817 may be formed through solder applied, in a bypass manner, from the first face 8101 to the second face 8102 through the side face 8103. According to an embodiment, the first support pad 816 and the second support pad 817 may be formed to have a wider area than the peripheral connection pads 811 and 812. According to an embodiment, the first support pad 816 and the second support pad 817 may be formed to be higher than the peripheral connection pads 811 and 812. In this case, the support pads 816 and 817 may be formed by increasing the introduction of solder by increasing the thickness of a metal mask. According to an embodiment, when the printed circuit boards 820 and 830 face the interposer 810, since the printed circuit boards 820 and 830 are supported by the support pads 816 and 817 formed higher than the connection pads 811 and 812, it is possible to prevent the connection pads 811 and 812 from being pressed and damaged.

Figure 9A:
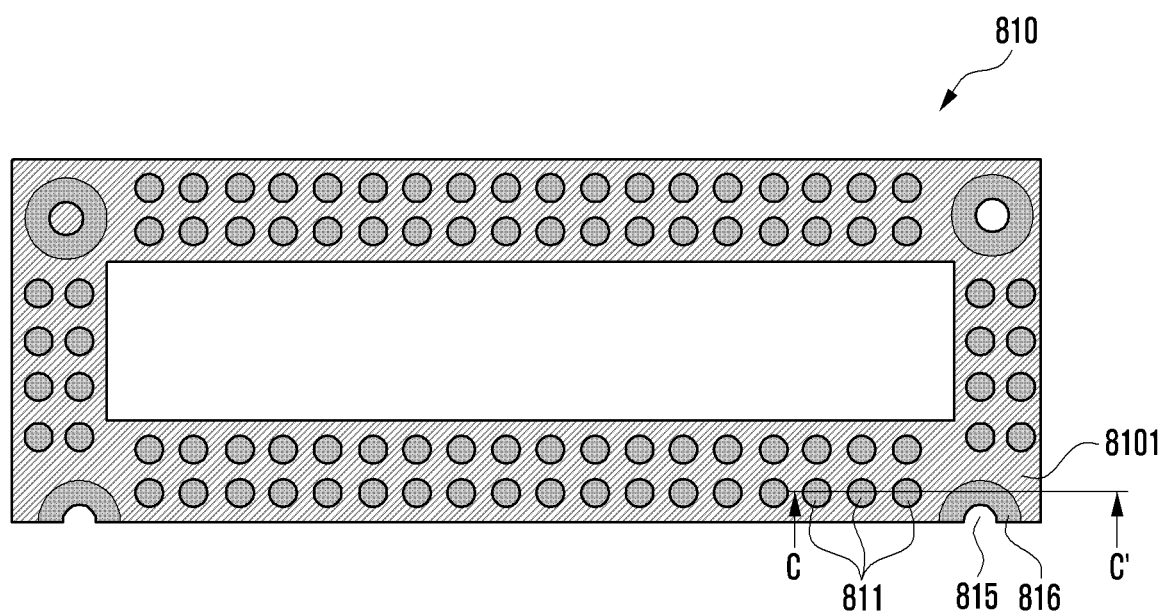
FIG. 9A is a plan view illustrating the configuration of an interposer according to certain embodiments.
Figure 9B:
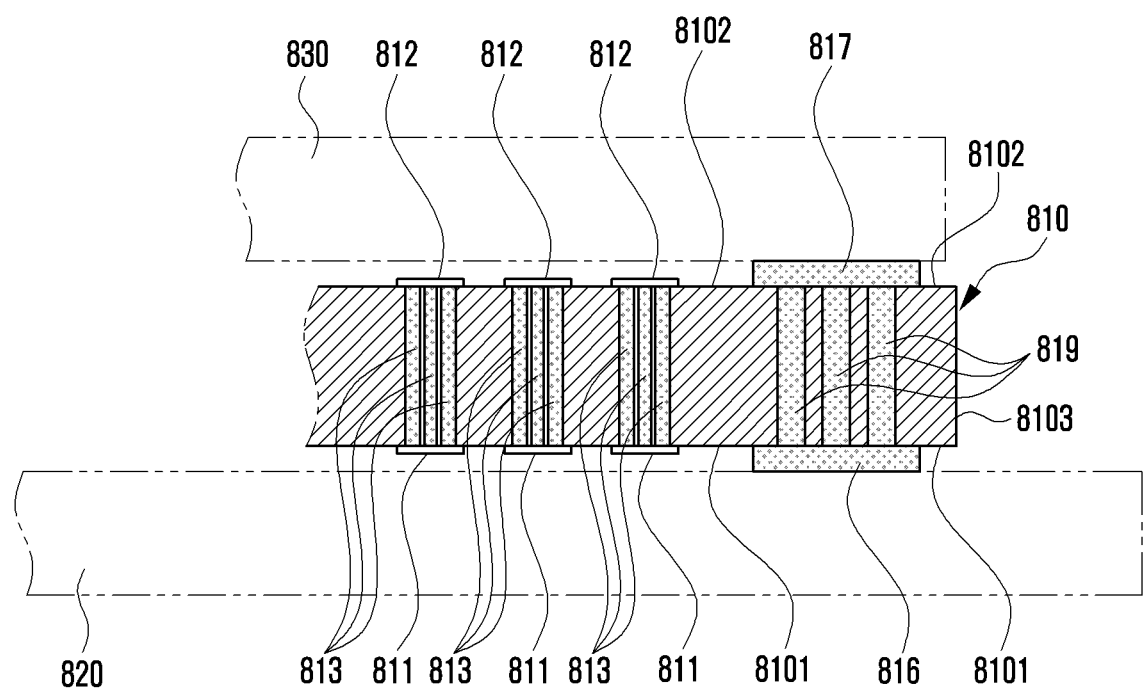
FIG. 9B is a cross-sectional view illustrating a portion of the interposer taken along line C-C' in FIG. 9A.

FIG. 9A is a plan view illustrating the configuration of an interposer 810 according to certain embodiments. FIG. 9B is a cross-sectional view illustrating a portion of the interposer 810 taken along line C-C' in FIG. 9A.

In describing FIGS. 9A and 9B, the electrical connection structures of a plurality of first connection pads 811 and a plurality of first connection pads 812 are substantially the same as those of FIGS. 8A and 8B, and thus a description thereof will be omitted.

Referring to FIGS. 9A and 9B, a first support pad 816 and a second support pad 817 may be electrically connected to each other via a plurality of conductive vias 819 formed to penetrate the interposer 810 from the first face 8101 to the second face 8102 at regular intervals. According to an embodiment, the plurality of conductive vias 819 may be formed of the same material when forming the plurality of conductive vias 813 connecting the first connection pads 811 and the second connection pads 812.

Figure 9C:
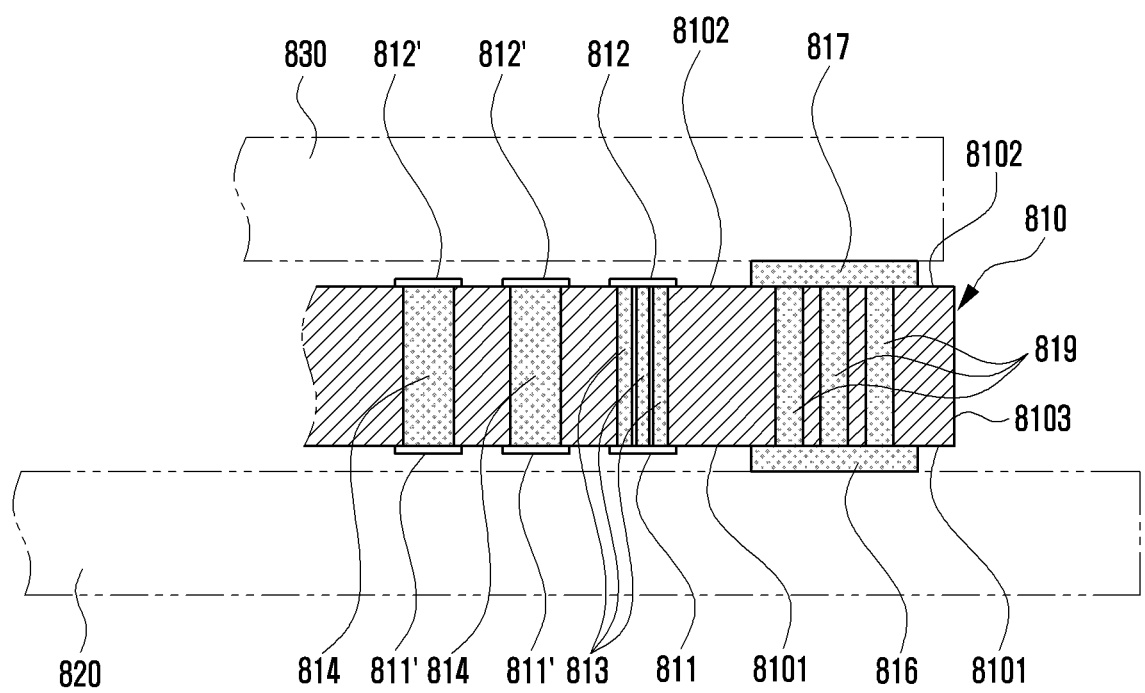
FIG. 9C is a cross-sectional view illustrating a portion of a modified interposer of that in FIG. 9B.

FIG. 9C is a cross-sectional view illustrating a portion of a modified interposer of that in FIG. 9B.

Referring to FIG. 9C, the interposer 810 may include a plurality of first connection pads 811 and 811' disposed on the first face 8101 and a plurality of second connection pads 812 and 812' disposed on the second face 8102. According to an embodiment, each of at least some connection pads 811' among the plurality of first connection pads 811 and 811' and each of at least some connection pads 812' among the plurality of second connection pads 812 and 812' may be electrically connected to each other via one conductive via 814. In this case, the one conductive via 814 may be formed of a conductive material (e.g., Cu) having a volume larger than each of at least two conductive vias 813, thus helping to reduce a DC resistance (DCR). As another embodiment, each of at least some connection pads 811' among the plurality of first connection pads 811 and 811' and each of at least some connection pads 812' among the plurality of second connection pads 812 and 812' may be allocated to transmit the same signal, whereby, even if one conductive via 814 is damaged or cracked, signal non-transmission risk may be reduced.

According to certain embodiments, each of at least some connection pads 811 among the plurality of first connection pads 811 and 811' and each of at least some connection pads 812 among the plurality of second connection pads 812 and 812' may be electrically connected to each other via at least two conductive vias 813. For example, in the case of a signal in which distortion may occur (e.g., a high-speed signal of USB), it may be advantageous to electrically connect the first connection pad 811 and the second connection pad 812 to each other via at least two conductive vias 813.

According to certain embodiments, even when two printed circuit boards are stacked using an interposer, it is possible to fix only the support member and one printed circuit board via a fastening member. Thus, it is possible to ensure the reliability of the electronic device by preventing the interposer from being damaged by an external impact.

According to certain embodiments, an electronic device (e.g., the electronic device 400 in FIG. 4A) may include: a first support member (e.g., the first support member 411 in FIG. 4B) disposed in an inner space of the electronic device and including at least one screw-fastening portion (e.g., the screw-fastening portion 412 in FIG. 4B); a first printed circuit board (e.g., the first printed circuit board 420 in FIG. 4B) stacked on the first support member and including at least one screw-fixing portion (e.g., the screw-fixing portion 422 in FIG. 4B) facing the at least one screw-fastening portion; a second printed circuit board (e.g., the second printed circuit board in FIG. 4B) spaced apart from the first printed circuit board and including at least one first screw guide groove (e.g., the at least one first screw guide groove 432 in FIG. 4B) facing the at least one screw-fixing portion; an interposer (e.g., the interposer 440 in FIG. 4B) disposed between the first printed circuit board and the second printed circuit board to electrically connect the first printed circuit board and the second printed circuit board and including at least one second screw guide groove (e.g., the second screw guide groove 442 in FIG. 4B) facing the at least one first screw guide groove; and a second support member (e.g., the second support member 450 in FIG. 4B) disposed between the second printed circuit board and the second plate and including a screw inlet portion (e.g., the screw inlet portion 452 in FIG. 4B) facing the at least one first screw guide groove. The second support member, the first printed circuit board, and the first support member may be fixed to each other via a screw (e.g., the screw 470 in FIG. 4B) applied through the screw inlet portion in the second support member.

According to certain embodiments, the screw-fixing portion may be disposed at a position overlapping the first screw guide groove and/or the second screw guide groove when the second support member is viewed from above.

According to certain embodiments, the screw-fixing portion may be formed to be smaller than the first screw guide groove and/or the second screw guide groove.

According to certain embodiments, the first screw guide groove and the second screw guide groove may be formed to have a same size and/or shape.

According to certain embodiments, the screw inlet portion may include a through hole (e.g., the through hole 4521 in FIG. 4B) and may be formed at a position facing the second screw guide groove to be lower than the face of the second support member.

According to certain embodiments, the electronic device may further include a washer member (e.g., the washer member 460 in FIG. 4B) interposed between the screw-fixing portion in the first printed circuit board and the screw-inlet portion in the second support member.

According to certain embodiments, the washer member may be at least partially accommodated in the first screw guide groove and the second screw guide groove, and may be disposed in parallel with the first screw guide groove and the second screw guide groove.

According to certain embodiments, the washer member may be formed to have a thickness that is at least equal to or greater than the sum of thicknesses of the second printed circuit board and the interposer.

According to certain embodiments, the washer member may be placed on a top face including the screw-fixing portion in the first printed circuit board, and may be disposed to be pressed by the screw inlet portion in the second support member.

According to certain embodiments, the electronic device may further include an extension (e.g., the extension 4522 in FIG. 7) extending from the screw inlet portion towards the first support member, and the extension may be disposed so as to be at least partially accommodated in the first screw guide groove and the second screw guide groove.

According to certain embodiments, the extension may be formed to have a depth that comes into contact with the top face of the first printed circuit board when assembled.

According to certain embodiments, the interposer (e.g., the interposer 810 in FIG. 8) may include a first face (e.g., the first face 8101 in FIG. 8B) facing the first support member, a second face (e.g., the second face 8102 in FIG. 8B) facing away from the first face, a side face (e.g., the side face 8103 in FIG. 8B) surrounding the space between the first face and the second face; and a pair of support pads (e.g., the support pads 816 and 817 in FIG. 8B) disposed to surround the second screw guide groove and to be exposed on the first face and the second face.

According to certain embodiments, the pair of support pads may be electrically connected to each other by a conductive material (e.g., the conductive material 818 in FIG. 8B) applied to the side face to extend from the support pad (e.g., the first support pad 816 in FIG. 8B) on the first face to the support pad (e.g., the second support pad 817 in FIG. 8B) on the second face.

According to certain embodiments, the interposer may further include a plurality of connection pads (e.g., the connection pads 811 and 812 in FIG. 8*b*) disposed to be exposed on the first face and the second face, and a plurality of conductive vias (e.g., the conductive vias 813 in FIG. 8B) formed to penetrate the interposer from the first face to the second face and electrically connecting the connection pads, and the support pads may have a larger area than the connection pads.

According to certain embodiments, the interposer may further include a plurality of connection pads disposed to be exposed on the first face and the second face, and a plurality of conductive vias formed to penetrate the interposer from the first face to the second face and electrically connecting the connection pads, and the support pads may have a higher height than the connection pads.

According to certain embodiments, the pair of support pads may be electrically connected to each other via at least one conductive via (e.g., the conductive via 819 in FIG. 9B) formed to penetrate the interposer from the first face to the second face.

According to certain embodiments, the first support member may be formed to extend from a side member of the electronic device to the space.

According to certain embodiments, the electronic device may further include a display (e.g., the display 330 in FIG. 3) disposed in the inner space to be externally visible through at least a portion of the electronic device.

According to certain embodiments, an electronic device (e.g., the electronic device 400 in FIG. 4A) may include: a housing (e.g., the housing 110 in FIG. 1A) including a first plate (e.g., the first plate 481 in FIG. 4A), a second plate (e.g., the second plate 480 in FIG. 4A) facing away from the first plate, and a side member (e.g., the side member 410 in FIG. 4A) surrounding a space between the first plate and the second plate; a first support member (e.g., the first support member 411 in FIG. 4B) disposed in the space to be substantially parallel with the first plate and including at least one screw-fastening portion (e.g., the screw-fastening portion 412 in FIG. 4B); a first printed circuit board (e.g., the first printed circuit board 420 in FIG. 4B) disposed between the first support member and the second plate and including at least one screw-fixing portion (e.g., the screw-fixing portion 422 in FIG. 4B) facing the at least one screw-fastening portion; a second printed circuit board (e.g., the second printed circuit 430 in FIG. 4B) disposed between the first printed circuit board and the second plate and including at least one first screw guide groove (e.g., the at least one first screw guide groove 432 in FIG. 4B) facing the at least one screw-fixing portion; an interposer (e.g., the interposer 440 in FIG. 4B) disposed between the first printed circuit board and the second printed circuit board to electrically connect the first printed circuit board and the second printed circuit board and including at least one second screw guide groove (e.g., the second screw guide groove 442 in FIG. 4B) facing the at least one first screw guide groove; and a second support member (e.g., the second support member 450 in FIG. 4B) disposed between the second printed circuit board and the second plate and including a screw inlet portion (e.g., the screw inlet portion 452 in FIG. 4B) facing the at least one first screw guide groove. The second support member, the first printed circuit board, and the first support member may be fixed to each other via a screw (e.g., the screw 470 in FIG. 4B) applied through the screw inlet portion in the second support member.

According to certain embodiments, the screw-fixing portion may be disposed at a position overlapping the first screw guide groove and/or the second screw guide groove when the first plate is viewed from above.

The embodiments of the disclosure disclosed in the specification and the drawings are only particular examples proposed in order to easily describe the technical matters of the disclosure and help with comprehension of the disclosure, and do not limit the scope of the disclosure. Therefore, in addition to the embodiments disclosed herein, the scope of the certain embodiments of the disclosure should be construed to include all modifications or modified forms drawn based on the technical idea of the certain embodiments of the disclosure.

What is claimed is:

1. An electronic device, comprising:
    a first support member disposed in an inner space defined within the electronic device and including at least one screw-fastening portion;
    a first printed circuit board stacked on the first support member and including at least one screw-fixing portion disposed facing the at least one screw-fastening portion;
    a second printed circuit board spaced apart from the first printed circuit board and including at least one first screw guide groove facing the at least one screw-fixing portion;
    an interposer disposed between the first printed circuit board and the second printed circuit board to electrically connect the first printed circuit board and the second printed circuit board, and the interposer including:
        at least one second screw guide groove facing the at least one first screw guide groove,
        a first face facing the first support member,
        a second face facing away from the first face,
        a side face surrounding a space defined between the first face and the second face; and
        a pair of support pads, disposed to surround the second screw guide groove, and exposed on the first face and the second face; and
    a second support member stacked on the second printed circuit board and including a screw inlet portion facing the at least one first screw guide groove,
    wherein the second support member, the first printed circuit board, and the first support member are affixed to each other via a screw inserted through the screw inlet portion in the second support member.

2. The electronic device of claim 1, wherein the screw-fixing portion is disposed at a position overlapping the first screw guide groove and/or the second screw guide groove.

3. The electronic device of claim 2, wherein the screw-fixing portion is smaller than the first screw guide groove and/or the second screw guide groove.

4. The electronic device of claim 1, wherein the first screw guide groove and the second screw guide groove are formed to have a same size and/or shape.

5. The electronic device of claim 1, wherein the screw inlet portion defines a through hole and is disposed facing the second screw guide groove and lower than a face of the second support member relative to a front face of the electronic device.

6. The electronic device of claim 5, further comprising:
    a washer member interposed between the screw-fixing portion in the first printed circuit board and the screw inlet portion in the second support member.

7. The electronic device of claim 6, wherein the washer member is at least partially accommodated in the first screw guide groove and the second screw guide groove, and is disposed in parallel with the first screw guide groove and the second screw guide groove.

8. The electronic device of claim 7, wherein the washer member includes a thickness that is at least equal to or greater than a sum of thicknesses of the second printed circuit board and the interposer.

9. The electronic device of claim 8, wherein the washer member is placed on a top face including the screw-fixing portion in the first printed circuit board, and is pressed by the screw inlet portion into the second support member.

10. The electronic device of claim 5, further comprising:
an extension member extending from the screw inlet portion towards the first support member,
wherein the extension member is at least partially accommodated in the first screw guide groove and the second screw guide groove.

11. The electronic device of claim 10, wherein the extension member defines a depth such that a portion of the extension member contacts with a top face of the first printed circuit board when assembled.

12. The electronic device of claim 1, wherein the pair of support pads are electrically connected to each other by a conductive material disposed on the side face extending from a first support pad on the first face to a second support pad on the second face.

13. The electronic device of claim 1, wherein the interposer further includes:
a plurality of connection pads exposed on the first face and the second face; and
a plurality of conductive vias formed to penetrate the interposer from the first face to the second face and electrically connecting the connection pads,
wherein the pair of support pads include a larger area than the connection pads.

14. The electronic device of claim 1, wherein the interposer further includes:
a plurality of connection pads exposed on the first face and the second face; and
a plurality of conductive vias formed to penetrate the interposer from the first face to the second face and electrically connecting the connection pads,
wherein the pair of support pads include a higher height than the connection pads.

15. The electronic device of claim 1, wherein the pair of support pads are electrically connected to each other via at least one conductive via formed to penetrate the interposer from the first face to the second face.

16. The electronic device of claim 1, wherein the first support member extends from a side member of the electronic device towards the inner space.

17. The electronic device of claim 1, further comprising:
a display disposed in the inner space and externally visible to an exterior of the electronic device through at least a portion of the electronic device.

18. An electronic device comprising:
a housing including a first plate, a second plate facing away from the first plate, and a side member surrounding a space defined between the first plate and the second plate;
a first support member disposed in the space substantially in parallel with the first plate, and including at least one screw-fastening portion;
a first printed circuit board disposed between the first support member and the second plate, including at least one screw-fixing portion facing the at least one screw-fastening portion;
a second printed circuit board disposed between the first printed circuit board and the second plate, including at least one first screw guide groove facing the at least one screw-fixing portion;
an interposer disposed between the first printed circuit board and the second printed circuit board, electrically connecting the first printed circuit board and the second printed circuit board, and including:
at least one second screw guide groove facing the at least one first screw guide groove; and
a second support member disposed between the second printed circuit board and the second plate, including a screw inlet portion facing the at least one first screw guide groove,
wherein the second support member, the first printed circuit board, and the first support member are fixed to each other via a screw inserted through the screw inlet portion in the second support member.

19. The electronic device of claim 18, wherein the screw-fixing portion is disposed at a position overlapping the first screw guide groove and/or the second screw guide groove.

* * * * *